(12) United States Patent
Constancias

(10) Patent No.: US 9,934,934 B2
(45) Date of Patent: Apr. 3, 2018

(54) ELECTROSTATIC LENS HAVING A DIELECTRIC SEMICONDUCTING MEMBRANE

(71) Applicant: COMMISSARIAT A L'ENERGIE ATOMIQUE ET AUX ENERGIES ALTERNATIVES, Paris (FR)

(72) Inventor: Christophe Constancias, Sarcenas (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 14/894,800

(22) PCT Filed: May 26, 2014

(86) PCT No.: PCT/EP2014/060866
§ 371 (c)(1),
(2) Date: Nov. 30, 2015

(87) PCT Pub. No.: WO2014/191370
PCT Pub. Date: Dec. 4, 2014

(65) Prior Publication Data
US 2016/0111244 A1  Apr. 21, 2016

(30) Foreign Application Priority Data

May 31, 2013 (FR) ..................................... 13 54992

(51) Int. Cl.
*H01J 37/12* (2006.01)
(52) U.S. Cl.
CPC ......... *H01J 37/12* (2013.01); *H01J 2237/063* (2013.01); *H01J 2237/12* (2013.01); *H01J 2237/1534* (2013.01); *H01J 2237/21* (2013.01)

(58) Field of Classification Search
CPC ...... H01J 37/12; H01J 37/063; H01J 2237/12; H01J 2237/21; H01J 2237/063
See application file for complete search history.

(56) References Cited

U.S. PATENT DOCUMENTS 3,780,334 A * 12/1973 Leboutet ................. H01J 33/00
313/299
4,567,399 A  1/1986 Van Gorkum
(Continued)

FOREIGN PATENT DOCUMENTS

EP  0 500 179 A1  8/1992
EP  1 492 151 A2  12/2004
(Continued)

OTHER PUBLICATIONS http://www.ioffe.ru/SVA/NSM/Semicond/GaAs/basic.html GaAS physical properties No publish date or author given or required.*
(Continued)

*Primary Examiner* — Jason McCormack
*Assistant Examiner* — Sean Luck
(74) *Attorney, Agent, or Firm* — Baker Hostetler LLP

(57) ABSTRACT

Electrostatic lenses for focusing a beam of charged particles, and in particular an electron beam, are used especially in the electron guns of electron microscopes or electron-beam lithography apparatuses. The present disclosure improves the possibilities for focusing the particle beam, in particular an electron beam emitted by a cathode. The lens comprises at least one conducting electrode having at least one through-opening for the passage of an electron beam. Different electric fields are set up upstream and downstream of the opening. The passage opening is at least partially closed by a planar or curved thin membrane of semi-conducting material that is transparent to electrons and has a high dielectric permittivity. Structuring the membrane (holes or
(Continued)

thickened portions of electrodes deposited on the membrane) makes it possible to correct lens aberration defects.

7 Claims, 3 Drawing Sheets

(56) References Cited

U.S. PATENT DOCUMENTS

| | | | | |
|---|---|---|---|---|
| 4,680,467 A | * | 7/1987 | Bryson, III | G01N 23/227 250/305 |
| 5,612,588 A | * | 3/1997 | Wakalopulos | B29C 71/04 313/35 |
| 5,633,502 A | * | 5/1997 | Fischione | G01N 1/32 250/440.11 |
| 5,940,678 A | * | 8/1999 | Doong | G01R 31/307 438/14 |
| 5,986,264 A | * | 11/1999 | Grunewald | G01N 1/32 250/310 |
| 6,060,839 A | * | 5/2000 | Sverdrup, Jr. | H01J 1/32 315/160 |
| 6,140,652 A | * | 10/2000 | Shlepr | B01L 3/5085 250/440.11 |
| 6,188,068 B1 | * | 2/2001 | Shaapur | G01N 23/04 250/311 |
| 6,194,720 B1 | * | 2/2001 | Li | G01N 1/32 250/306 |
| 2004/0119021 A1 | | 6/2004 | Parker et al. | |
| 2005/0092929 A1 | * | 5/2005 | Schneiker | G21K 1/08 250/396 R |
| 2007/0131873 A1 | * | 6/2007 | Allred, Jr. | H01J 37/20 250/440.11 |
| 2010/0009134 A1 | * | 1/2010 | Drndic | B82Y 10/00 428/195.1 |
| 2010/0155620 A1 | * | 6/2010 | Hutchison | H01J 37/20 250/440.11 |
| 2011/0079710 A1 | * | 4/2011 | Damiano, Jr. | H01J 37/20 250/307 |
| 2011/0200787 A1 | * | 8/2011 | Regan | H01J 37/20 428/138 |

FOREIGN PATENT DOCUMENTS

| | | |
|---|---|---|
| EP | 1 811 540 A2 | 7/2007 |
| JP | 2007-189117 A | 7/2007 |
| WO | 2004/021391 A1 | 3/2004 |
| WO | 2007/129376 A1 | 11/2007 |
| WO | 2009/020208 A1 | 2/2009 |

OTHER PUBLICATIONS

Thon et al., "High resolution electron microscopy with special aperture shutters and phase plates," International Congress on Electron Microscopy, vol. 1, Aug. 30, 1970, pp. 3-4, XP009159615.
K. H. Muller, "Phase plates for electron microscopes," Optik, Wissenschaftliche Verlag GmbH, vol. 45, No. 1, Jan. 1, 1976, pp, 73-85, XP009134533.

* cited by examiner

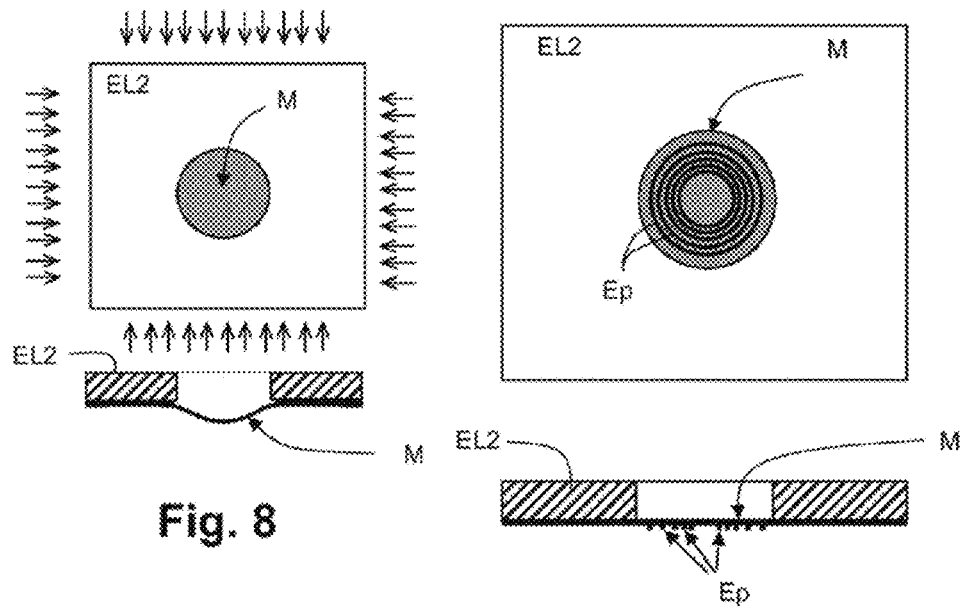
Fig. 8
Fig. 9
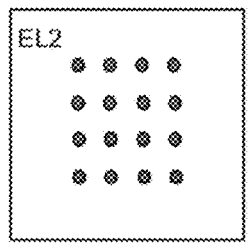
Fig. 11
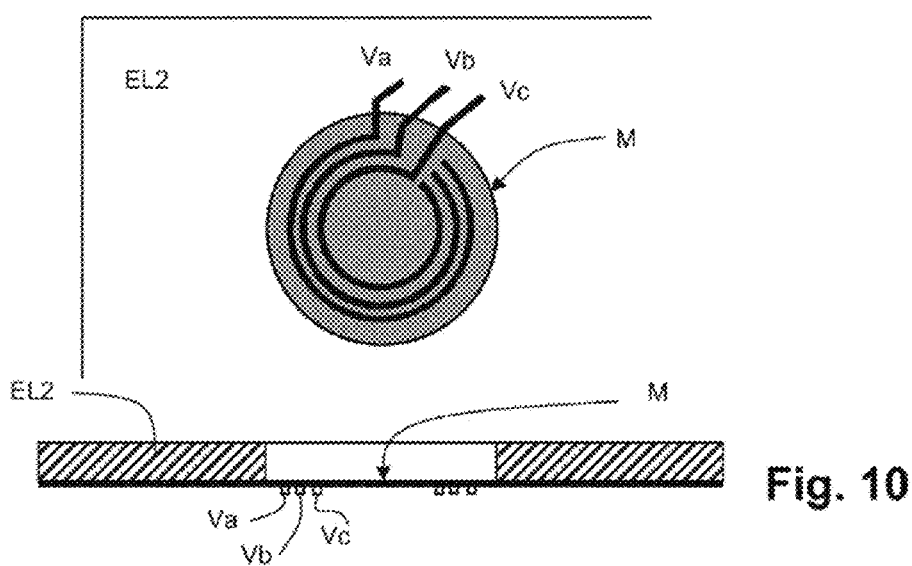
Fig. 10

US 9,934,934 B2

ELECTROSTATIC LENS HAVING A DIELECTRIC SEMICONDUCTING MEMBRANE

CROSS-REFERENCE TO RELATED APPLICATIONS

This application is a National Stage of International patent application PCT/EP2014/060866, filed on May 26, 2014, which claims priority to foreign French patent application No. FR 1354992, filed on May 31, 2013, the disclosures of which are incorporated by reference in their entirety.

FIELD OF THE INVENTION

The invention relates to electrostatic lenses intended to focus a beam of charged particles, and notably a beam of electrons. These lenses are notably used in the electron guns of electron microscopes or electron-beam lithography apparatuses.

One aim of the invention is to improve the possibilities of focusing the electron beam emitted by a cathode.

BACKGROUND

It will be recalled that an electrostatic lens is in essence formed in the following way: one or more plate electrodes, which are each pierced with a hole through which the electron beam passes, are placed on the path of the electron beam. Potentials are applied to the electrodes in order to induce different electric fields upstream and downstream of each electrode. The interaction between these electric fields and the electron beam deviates the electrons and directs them toward a focal zone or point. Focal length may be calculated quite simply from the values of the electric fields and the energy of the electrons.

For an electron beam of given energy, increasing the strength of the electric fields, and therefore the voltages applied to the electrodes, increases focal strength. However, focal strength decreases as the energy of the beam increases. This leads to difficulties focusing high-energy beams as it becomes necessary to apply very high voltages between closely spaced electrodes, thereby running the risk of breakdown.

Electrostatic lenses for focusing electrons moreover have a drawback in that they focus both electrons, and ions that have the same energy. As a result, if the electron beam emitted by a cathode and focused on a surface tears positive ions from this surface, these positive ions can stream back along the beam from downstream to upstream and bombard the cathode, on which the electrostatic lens tends to focus them; this creates a risk of deterioration of the cathode, or quite simply a risk of contamination affecting its properties. For this reason it is sometimes preferable to focus the electron beam with electromagnetic lenses, which do not have this drawback because they act differently on electrons and ions.

However, in certain applications electrostatic lenses are preferable. Specifically, electromagnetic lenses require coils, high currents and electromagnetic shields, thereby making them expensive. Less expensive focusing systems, which are notably applicable to beams of relatively low energy (less than 100 keV), rather use electrostatic lenses. This is the case for low-energy lithography systems, spectrometers, the electron guns of cathode-ray tubes, etc. Moreover, it would be difficult to use electromagnetic lenses in multibeam e-beam lithography systems because of the bulk of electromagnetic devices, and these systems must therefore use electrostatic lenses.

Lastly, it should be recalled that electrostatic lenses are affected by geometric aberrations and chromatic aberrations, or even astigmatic aberrations. These aberrations need to be taken into account and complex multipolar systems have already been proposed for correcting them, such as for example in patent publications EP0500179, EP1492151 and EP1811540. Curved conductive foils have also been suggested as a way of deforming the equipotentials around a beam-passing aperture in an accelerating electrode of an electron gun, with the aim of correcting spherical aberrations (U.S. Pat. No. 4,567,399).

SUMMARY OF THE INVENTION

The invention proposes an enhancement that improves the possibilities of focusing electron beams with electrostatic lenses.

Specifically, an electrostatic lens is proposed that is provided with at least one conductive electrode pierced with at least one aperture for passing an electron beam, characterized in that the passing aperture is closed at least partially by a thin membrane of a non-degenerate semiconductor that is transparent to the electrons of the beam and that has a relative dielectric permittivity of at least 10.

The semiconductor is preferably silicon with a doping density lower than $10^{19}$ atoms/cm$^3$. It may also be gallium arsenide or a silicon/germanium alloy.

The thickness of the membrane is preferably smaller than 2 microns in order to ensure the electron beam is not greatly attenuated or dispersed (for beams of at least 50 keV).

The membrane material, which is not a conductor, but of high dielectric permittivity, passes electric field lines and generates a large discontinuity in radial electric field between the entrance and exit of the membrane. This discontinuity improves the focus obtained relative to that obtained with an open hole devoid of membrane, or relative to that obtained with an aperture closed by a conductive membrane.

The presence of the semiconductor membrane modifies the properties of the focus, decreasing the focal length obtained with given applied electric field strengths, or decreasing the electric field strengths required to obtain a given focal length. The risk of breakdown is thus decreased. This membrane also acts to decrease back streaming of positive ions toward the electron source as it forms a material obstacle to such back streaming.

In addition, the presence of this membrane makes it easier to correct focal aberrations, geometric or chromatic aberrations, caused by the lens. Specifically, to make certain corrections, the membrane may be structured by modulating its thickness by etching or by depositing insulators, or even by depositing on the thin membrane an (unbiased) conductor etched with a set pattern. This correction of aberrations by structuring of the thin membrane is much simpler to achieve than the multipolar correction envisioned in the prior art.

The electrode of the electrostatic lens may comprise a plurality of apertures for passing electrons, each closed with a thin semiconductor membrane, in order to allow a plurality of electron beams to pass, notably in multibeam lithography applications. Each membrane may be structured.

BRIEF DESCRIPTION OF THE DRAWINGS

Other features and advantages of the invention will become apparent on reading the following detailed description given with reference to the appended drawings, in which:

FIG. 8 shows the central electrode with its membrane in a configuration in which the membrane is not planar;

FIG. 9 shows an embodiment in which the membrane possesses a variable thickness;

FIG. 10 shows an embodiment in which the membrane bears metal electrodes; and

FIG. 11 shows a central electrode with a plurality of apertures each closed by one respective membrane for a multibeam lens.

DETAILED DESCRIPTION

Figure 1:
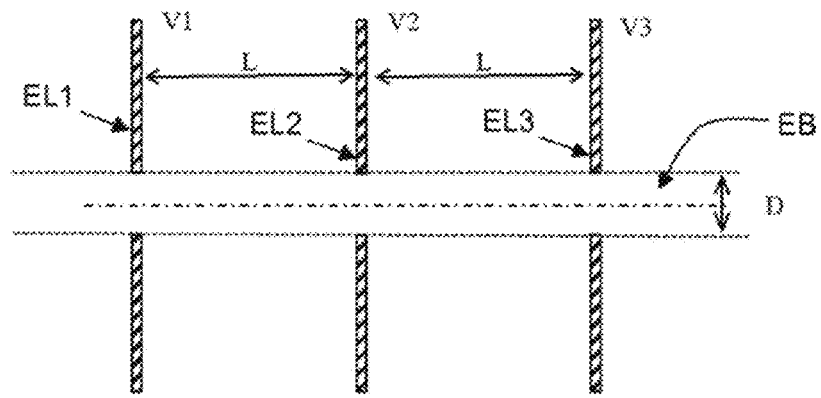
FIG. 1 shows the general principle of an electrostatic lens.

The general principle of an electrostatic lens intended to focus an electron beam is recalled in FIG. 1.

A central electrode EL2 is formed by a conductive plate pierced with an aperture, of diameter D, for passing an electron beam EB; it is raised to a potential V2. Different electric fields of strength Ea and Eb are created on either side of the aperture, and the presence of these different fields generates the electrostatic focusing effect as they create a radial field in the vicinity of the aperture in the electrode. These fields are for example created by two other electrodes EL1 and EL3, respectively upstream and downstream of the electrode EL2 in the direction of travel of the beam, which electrodes EL1 and EL3 are raised to respective potentials V1 and V3. These two other electrodes are also pierced with apertures in order to allow the electron beam to pass. The diameter of the beam and therefore of the apertures may be very small, as small as a few tens of microns, but may also be several millimeters.

The focal length F of the electrostatic lens thus formed is given to a first approximation by $1/F=-(Eb-Ea)/4Vf$ where Vf is the energy of the electron beam.

The electrodes are shown as being plates pierced with a hole. They could also be hollow cylinders juxtaposed along the axis of the beam, the inside diameter of the cylinder then being the diameter D of the aperture; the cylinders are raised to different potentials and the lens effect is generated at the junction between two cylinders.

Figure 2:
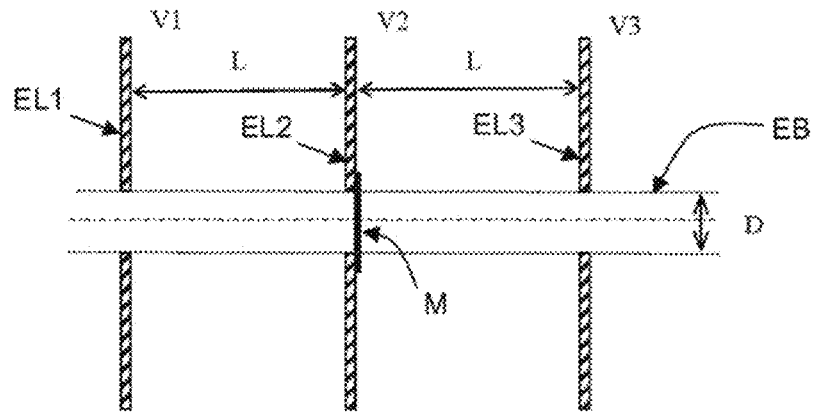
FIG. 2 shows the principle of an electrostatic lens according to the invention with a thin semiconductor membrane.

The principle of the lens according to the invention is shown in FIG. 2. The passing aperture in the electrode EL2 is closed by a thin membrane M made of a semiconductor that is transparent to the electrons and that has a high relative permittivity (higher than 10). In the general case, the membrane completely closes the aperture, as is shown in FIG. 2, but in certain cases it may be envisioned for the closure to be only partial, the membrane possibly containing windows. In the example shown, the membrane is planar but it will be seen that it may be curved (bell-shaped or a spherical or almost spherical dome shape).

Figure 3:
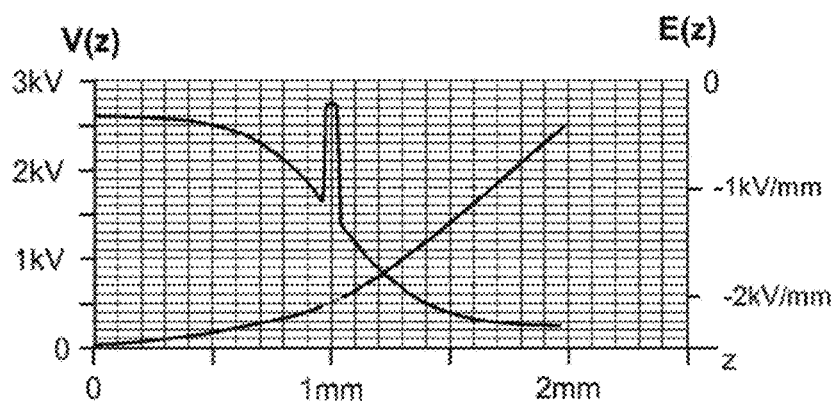
FIG. 3 shows the general pattern of the electric field along the axis of the beam in the presence of potentials applied to the electrodes of the lens, the central lens being obstructed by a thin membrane.

The conductivity of the silicon is low, its doping density being lower than $10^{19}$ atoms/cm$^3$. The silicon (or other semiconductor) must be non-degenerate, i.e. the Fermi level of the n- or p-doped semiconductor must not be so close to the valence band or conduction band that the membrane material ceases to have the properties of a semiconductor and in particular ceases to have an electrical conductivity that increases with temperature. Silicon doped with a doping density lower than $10^{19}$ atoms/cm$^3$ meets this condition. A doping density of $10^{22}$ to $10^{23}$ atoms/cm$^3$ would be needed to make the silicon degenerate. The membrane is electrically connected to the central electrode, but its limited conductivity means that it is not raised to the same potential over its entire area, as it would be if it were made of a conductor (metal or more highly doped or degenerate silicon). FIG. 3 shows the pattern of the electric field along the axis of the beam when potentials of 10 volts, 200 volts and 2500 volts (values given by way of example) are applied to the respective electrodes EL1, EL2 and EL3 located at respective abscissae of 0 millimeters, 1 millimeter and 2 millimeters (origin arbitrarily placed at the first electrode). The thin semiconductor membrane creates a discontinuity in the field, because of the dielectric constant of the membrane. The higher the dielectric constant, the larger the discontinuity. The modification in the profile of the electric field along the axis of the beam between upstream and downstream of the central electrode is an element of substantial action on the focal length of the lens. Focal length may be deduced by calculating the paths taken by the electrons in the presence of the electric fields to which they are subjected. The paths taken by the electrons may be deduced directly from an equation that, if third- and higher-order derivatives are neglected, i.e. if geometric and chromatic aberrations are neglected, may be written (for an axisymmetric lens):

$$4V(z)r''(z)+2V'(z)r'(z)+V''(z)r(z)=0$$

where r(z) is the distance from the axis of an electron of abscissa z (the abscissa is defined along the axis); V(z) is the potential on the optical axis at the abscissa (z) at which the electron is located; r'(z) is the derivative of r with respect to the abscissa z along the axis; r''(z) is the second derivative of r, i.e. the derivative of r'(z) with respect to z; V'(z) is the derivative of V(z) with respect to the abscissa z; and V''(z) is the second derivative of V(z).

To the first order, the difference in the electric fields upstream and downstream of the central electrode EL2 has a direct effect on the focal length; therefore, the first derivative of the potential V(z) has a direct effect on the focal length. However, to the second order, the second derivative plays an important role in the calculation of the paths and on the focal length; therefore, the presence of the thin membrane of dielectric constant other than 1, which modifies the second derivative of the potential, modifies focal length.

In one exemplary embodiment, the three electrodes of the lens are considered to be separated by successive intervals of 1 millimeter, the diameter of the central aperture closed by a membrane being about 0.6 millimeters. The moduli of the electric fields Ei (at the entrance of the membrane), Em (in the middle of the membrane), Eo (at the exit of the membrane) are calculated with respective electrical potentials of 0 volts, 150 volts and 10 000 volts applied to the electrodes.

In the case where the membrane is absent, the dielectric permittivity in the hole in the central electrode is that of vacuum and therefore zero. The electric fields vary little on the path followed through the aperture in the central electrode:

$$Ei=Em=400 \text{ kV/cm}.$$

In the case of a conductive membrane, the moduli of the fields are:

$Ei=100$ kV/cm, $Em=0$ V/cm and $Eo=4$ kV/cm.

Placing a conductive membrane in the aperture of the central electrode leads to a radial electric field of zero.

In the case of a high-permittivity dielectric membrane made of silicon doped to at least $10^{19}$ atoms/cm$^3$, the moduli of the fields are:

$Ei=100$ kV/cm, $Em=500$ V/cm and $Eo=400$ kV/cm.

Figure 4:
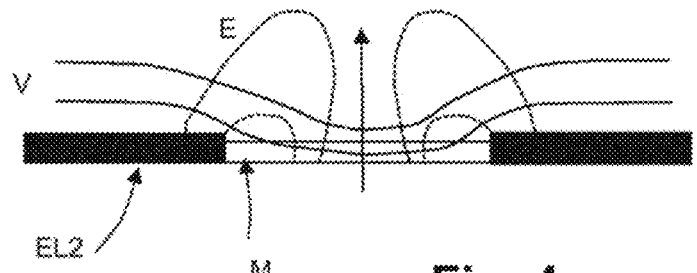
FIG. 4 shows the configuration of lines of potential and field lines in the vicinity of the membrane.

The larger the variation in radial field on the path followed through the aperture of the central electrode, the better the focus, and it turns out that using a weakly conductive membrane of high dielectric permittivity yields the best results. FIG. 4 shows the configuration of lines of potential V and field lines E in immediate proximity to the high-dielectric-permittivity membrane. The arrow indicates the direction of travel of the electrons to be focused. The field lines are very different from those that would be generated if the membrane were absent or if a conductive membrane were present.

The table below gives, by way of example, the focal lengths obtained as a function of the value of the potential V3 applied to the electrode EL3, the other potentials remaining constant (V1=10 volts, V2=200 volts), for three different values of membrane relative dielectric permittivity $\in_r$: $\in_r=1$ (equivalent to the absence of a membrane), $\in_r=3.9$ (membrane made of silicon nitride), $\in_r=11.9$ (membrane made of silicon of doping density lower than $10^{19}$ at/cm$^3$). The membrane is less than 1 micron thick.

| | V1 = 10 volts, V2 = 200 volts | | |
|---|---|---|---|
| | Focal length for vacuum, an SiN insulator and silicon | | |
| V3 | Vacuum $\varepsilon_r = 1$ | SiN $\varepsilon_r = 3.9$ | Si $\varepsilon_r = 11.9$ |
| 500 volts | 8.80 mm | 4.02 mm | 3.78 mm |
| 2500 volts | 0.875 mm | 0.727 mm | 0.700 mm |
| 5000 volts | 0.644 mm | 0.550 mm | 0.534 mm |

It will be understood from this table that it is possible, in the absence of a membrane, to decrease focal length to below 0.644 mm by increasing the voltage V3 above 5000 volts. However, increasing the voltage V3 increases the risk of breakdown. However, focal length may be decreased to 0.534 mm in the presence of a membrane of sufficiently high permittivity without increasing the voltage V3.

Likewise, it may be deduced from this table that if a focal length of 0.644 mm is required, it may be obtained with a voltage V3 of about 3000 volts and not 5000 volts if a thin membrane of silicon is used.

Use of such a membrane assumes that it is sufficiently transparent to electrons. The expression "sufficiently transparent" is understood to mean a transparency preferably higher than 98%. For a given membrane material, this transparency depends both on the thickness of the membrane and the energy of the electrons of the beam: it decreases with thickness and increases with energy.

The transparency of the membrane also depends on the material from which it is made and principally on the atomic number of the constituents of this material, transparency decreasing as atomic number increases.

Transparency may be modeled using equations such as the Bethe formula, which describes the loss of energy (−dE) of a beam of electrons along an elementary distance (dS) through a layer of material:

$$-\frac{dE}{dS} = \frac{4\pi NZ}{(4\pi\varepsilon_0)^2} \cdot \frac{e^4}{2E_0} \ln\left(\frac{4E_0}{I}\right)^{1/2}$$

where:
$\in_0$ is the permittivity of vacuum;
e is the charge of the electron;
N is the number of atoms per unit volume; this number is related to the density of the material: density is higher if N is higher and is lower if N is lower;
Z is the atomic number of the material;
$E_0$ is the energy of the incident electrons; and
I is the average ionization energy of the material through which the electrons are passing; it depends on atomic number and it is defined empirically; a value given in the literature is sometimes, in electron-volts, $I=(9.76+58.8\times Z^{1.19})$ for Z higher than or equal to 13, or sometimes the simplified expression $I=11.5\times Z$.

It is therefore preferable to produce the membrane from constituents of low atomic number. Silicon is particularly advantageous because its associated deposition and etching technological processes are well characterized as it is highly used in microelectronics. Gallium arsenide and the semiconductor alloy SiGe are two other semiconductors that may be envisioned.

Figure 5:
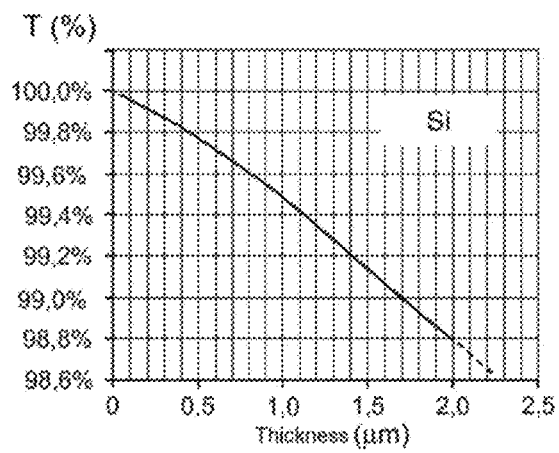
FIG. 5 shows the transparency of a membrane made of silicon to electrons of 50 keV as a function of its thickness.

FIG. 5 shows, by way of example, the variation in transmission coefficient T as a function of the thickness of the membrane for a beam of 50 keV energy and a membrane made of silicon. The transmission coefficient remains above 98% for thicknesses in the region of 2 microns.

Figure 6:
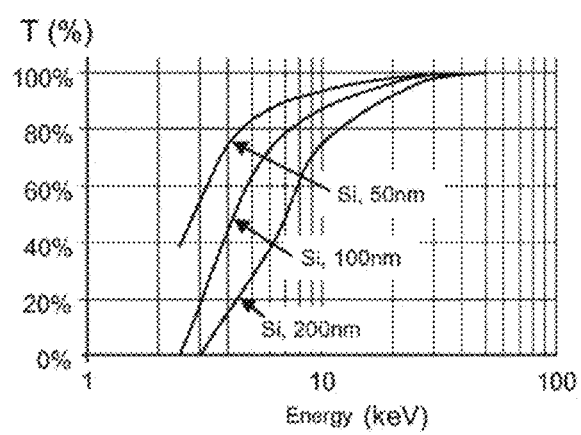
FIG. 6 shows the transparency of the membrane to electrons as a function of the energy of the beam for a membrane made of silicon and for various thicknesses.

FIG. 6 shows the variation in transmission coefficient as a function of the energy of the beam for various thicknesses, for membranes made of silicon Si. It may be seen from these curves that it is preferable to use membranes of thickness smaller than 50 nanometers if beam energy is lower than 20 keV, to obtain a transmission higher than 98%.

Figure 7:
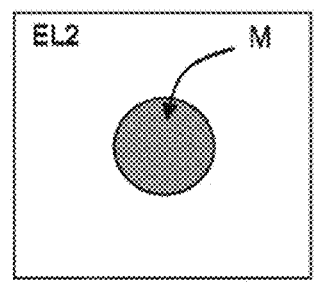
FIG. 7 shows front and cross-sectional views of the central electrode with its membrane.
Figure 7:
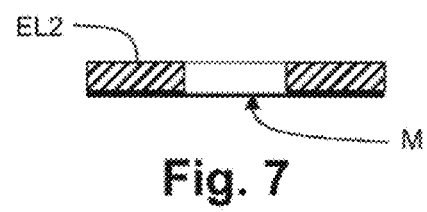

FIG. 7 shows the central electrode EL2 with its aperture closed by the semiconductor membrane M. The membrane may for example be produced by deep etching from the back side of a silicon wafer until only a superficial film remains. For example, the silicon wafer may be an SOI wafer, i.e. a silicon substrate covered with an insulating layer itself covered with a very thin silicon surface layer; the deep etching from the back side allows the substrate and the insulating layer to be removed locally until only the silicon surface layer remains, which then serves as the membrane. The silicon of the surface layer is then weakly doped silicon, in order to be sufficiently electrically insulating. Typically, its doping level is comprised between $10^{14}$ and $10^{19}$ atoms/cm$^3$ and preferably between $10^{14}$ and $10^{18}$ atoms/cm$^3$. The silicon substrate may be made of highly doped or degenerate silicon (with a donor or acceptor concentration higher than $10^{19}$ atoms/cm$^3$) and therefore be a conductor, in order to itself form the electrode in which the deep etching forms the aperture closed by the membrane. Alternatively, the silicon wafer may be added to the electrode, the aperture in the plate and the membrane formed in the wafer being arranged so as to coincide.

Generally, electrostatic lenses are affected by aberrations of a plurality of types: geometric aberrations and notably spherical aberrations and chromatic aberrations, or even astigmatic aberrations. The higher the magnification of the focusing system the greater the effect of geometric aberrations, and electron microscopes are particularly sensitive to this type of aberration. Spherical aberrations are due to the fact that electrostatic lenses are always more convergent for peripheral paths than for central paths. Chromatic aberrations are due to the fact that energy distribution is not uniform in the beam, certain electrons having more energy than others; the effect of chromatic aberrations also increases in significance as the magnification of the optical system increases. Astigmatic aberrations are due to alignment or symmetry defects in the lens; convergence varies as a function of the initial direction of the electrons and this defect is an astigmatic aberration.

These aberrations may be completely or partially corrected by the structure or shape of the semiconductor membrane. Of course, precise corrections can be determined only via simulations using software packages that evaluate the electrostatic fields and the path of the electrons. However, the following examples indicate possible membrane structures that affect the aberrations by way of local differences in the paths of the electrons as a function of the location where they pass through the membrane. These path differences result from the distribution of dielectric permittivity, which distribution is modified by modifying the structure of the membrane.

Firstly, the membrane may be curved rather than planar, as is shown in FIG. 8. It is known how to form bell-shaped or spherical, or almost spherical, dome-shaped membranes by applying peripheral stresses all the way around the plate, the aperture of which is closed by the membrane. For a silicon plate with an aperture closed by a silicon membrane, compressive stresses are applied to all the sides of the plate along the arrows shown in FIG. 8. The stresses may be mechanical or piezoelectric in origin.

Local apertures in the planar or curved membrane may have an action on the electric-field distribution and therefore on the paths of the electrons. These apertures may be distributed so as to partially correct certain aberrations. The apertures may in particular be arranged with a distribution that is not uniform over the area of the membrane, but that in contrast has a multipolar geometry (quadrupolar or hexapolar or octopolar) i.e. a distribution that contains variations as a function of angular position in the plane of the membrane. The geometry of the distribution of the holes may also vary as a function of a radial distance from the center of the beam, in addition or instead of varying as a function of angular position.

Local modifications in the thickness of the membrane may also have an effect. These modifications may be produced either by locally etching a portion of the thickness of the material of the membrane or by depositing another layer (which may be an insulator, semiconductor or conductor) on the membrane, and removing this layer locally. FIG. 9 shows a membrane with a locally modified thickness; in the case shown it is a question of additional thicknesses Ep arranged in concentric circles and therefore with circular symmetry, but here again the additional thicknesses may be distributed so as to privilege certain radial directions and certain distances, for example in order to obtain a multipolar geometry (notably a quadrupolar or hexapolar or octopolar geometry known to have an influence on the correction of spherical aberrations in axisymmetric lenses and in part on the correction of chromatic and astigmatic aberrations).

FIG. 10 shows another way of structuring the membrane: segments of a conductive layer are deposited on the membrane and potentials, the influence of which on the path of the electrons is determinable, are applied thereto. In particular, potentials may be applied that modify the electric fields differently depending on distance relative to the center of the beam. In FIG. 10, the electrodes formed on the membrane by deposition and etching of a conductive layer are circular and concentric and potentials Va, Vb and Vc are applied thereto. The area occupied by the electrodes must in total be quite small relative to the area of the aperture in order not to excessively decrease the transparency of the membrane to the electrons (unless the electrodes have a very small thickness, such as a few nanometers, and are made of a light material such as aluminum Al or the alloy AlSi); the thickness of the conductive layer must also be the smallest possible for the same reason.

The electrodes could also have a multipolar geometry (notably a quadrupolar, hexapolar or octopolar geometry) in order to act on one or other of the various sorts of observed aberrations. For example, four separate circularly arcuate electrodes opposed pairwise and distributed around a circle allow a quadrupolar structure to be created, allowing astigmatism to be acted on via application of two different potential differences to the pairs of opposed electrodes.

The aperture itself of the central electrode is in principle circular but could also be elliptical, rectangular or multipolar in shape, this shape also playing a role in the correction of aberrations by breaking axial symmetry.

Lastly, for multibeam applications, all that was said above may be applied to as many apertures as there are beams. FIG. 11 shows the electrode EL2 pierced with a plurality of holes each obstructed by a respective semiconductor membrane in order to form in the same planar electrode a plurality of electrostatic lenses. The electrodes EL1 and EL3 are also pierced with apertures that are located in correspondence with the apertures of the electrode EL2 along the axis of each of the electron beams.

The invention claimed is:

1. An electrostatic lens for focusing an electron beam comprising:
at least three conductive electrodes placed on a path of the electron beam, each conductive electrode being pierced with at least one aperture for passing the electron beam and being at a potential determined in order to induce different electric fields upstream and downstream of each electrode, a focal length value of the electrostatic lens depending on values of said potentials,
wherein the at least one passing aperture of at least one of the conductive electrodes is closed at least partially by a thin membrane of a non-degenerate semiconductor that is transparent to electrons of the beam and of relative dielectric permittivity higher than 10, the membrane being electrically connected to the corresponding conductive electrode and not connected to the other conductive electrodes, the connected membrane causing a modification of a value of the focal length with respect to a value of the focal length obtained with identical potential values but without the membrane.

2. The electrostatic lens of claim 1, wherein the semiconductor is silicon of doping density lower than $10^{19}$ atoms/$cm^3$, gallium arsenide, or silicon-germanium SiGe.

3. The electrostatic lens of claim 1, wherein the thickness of the membrane is smaller than 2 microns.

4. The electrostatic lens of claim 1, wherein the membrane is curved.

5. The electrostatic lens of claim 1, wherein the membrane is structured with apertures or thickness modulations or by depositing insulating, conductive or semiconductor layers.

6. The electrostatic lens of claim 5, wherein the structuring of the membrane has a multipolar configuration.

7. The electrostatic lens of claim 1, wherein the electrode includes a plurality of apertures each closed with a semiconductor membrane in order to focus a plurality of electron beams.

\* \* \* \* \*